United States Patent
Shirai et al.

(10) Patent No.: US 6,673,146 B2
(45) Date of Patent: Jan. 6, 2004

(54) METHOD OF MANUFACTURING A MAGNET-FREE FARADAY ROTATOR

(75) Inventors: Kazushi Shirai, Tokyo (JP); Norio Takeda, Tokyo (JP)

(73) Assignee: Photocrystal, Inc., Tokyo (JP)

( * ) Notice: Subject to any disclaimer, the term of this patent is extended or adjusted under 35 U.S.C. 154(b) by 0 days.

(21) Appl. No.: 10/106,042

(22) Filed: Mar. 27, 2002

(65) Prior Publication Data

US 2002/0139293 A1 Oct. 3, 2002

(30) Foreign Application Priority Data

Mar. 28, 2001 (JP) ........................................ 2001-092844

(51) Int. Cl.$^7$ ............................................... C30B 33/04
(52) U.S. Cl. ........................ 117/3; 359/280; 359/281; 359/282; 359/283; 359/284; 359/324; 359/484
(58) Field of Search ...................... 117/3; 359/280–284, 359/324, 484

(56) References Cited

U.S. PATENT DOCUMENTS

| | | | | |
|---|---|---|---|---|
| 5,212,586 A | * | 5/1993 | Van Delden | ................. 359/280 |
| 5,434,501 A | * | 7/1995 | Esman et al. | .................. 324/96 |
| 5,479,094 A | * | 12/1995 | Esman et al. | .................. 324/96 |
| 5,686,990 A | * | 11/1997 | Laznicka et al. | ........... 356/350 |
| 5,925,474 A | * | 7/1999 | Shirai et al. | ................. 428/692 |
| 6,031,654 A | * | 2/2000 | Hiramatsu et al. | ........... 359/280 |

* cited by examiner

*Primary Examiner*—Nadine G. Norton
*Assistant Examiner*—Matthew Anderson
(74) *Attorney, Agent, or Firm*—Sughrue Mion, PLLC

(57) ABSTRACT

A method of manufacturing is used to manufacture a magnet-free Faraday rotator having a square hysteresis loop, the Faraday rotator being formed of a bismuth-substituted rare earth iron garnet single crystal that has a compensation temperature in the range of 10 to 40° C. and is grown on a non-magnetic garnet substrate by a liquid phase epitaxy. The method comprising the steps of placing the bismuth-substituted rare earth iron garnet single crystal film in an environment of a temperature at least 20° C. away from the compensation temperature; and applying an external magnetic field higher than 1000 Oe to the bismuth-substituted rare earth iron garnet single crystal film so that the bismuth-substituted rare earth iron garnet single crystal film is magnetized to have a square hysteresis loop.

5 Claims, No Drawings

METHOD OF MANUFACTURING A MAGNET-FREE FARADAY ROTATOR

BACKGROUND OF THE INVENTION

1. Field of the Invention

The present invention relates to a Faraday rotator that is formed of a bismuth-substituted rare-earth iron garnet single crystal and does not use a permanent magnet, the bismuth-substituted rare-earth iron garnet single crystal being used as a Faraday rotator for optical isolators and optical circulators. More particularly, the present invention relates to a method of adding a square hysteresis loop to a bismuth-substituted rare-earth iron garnet single crystal having a compensation temperature near room temperature.

2. Description of the Related Art

Recently, optical fiber communications and optical instrumentation have taken a giant leap forward. Optical communications and optical instrumentation commonly use a semiconductor laser that serves as a signal source. A serious problem associated with a semiconductor laser is a so-called reflected light return where the light is reflected back by the end of the optical fiber and returns to the semiconductor laser. If light reflection return occurs, the oscillation of laser becomes unstable. Therefore, an optical isolator is disposed on the output side of the semiconductor laser to block the light reflection return, thereby stabilizing the oscillation of the laser.

Usually, an optical isolator includes a polarizer, an analyzer, a Faraday rotator and a permanent magnet that causes the Faraday rotator to be magnetically saturated. The Faraday rotator plays a critical role in the optical isolator. The Faraday rotator has a thickness of about several tens microns to about 400 μm and takes the form of a bismuth-substituted rare earth iron garnet single crystal (referred to as BIG hereinafter) grown by liquid phase epitaxy (LPE). Such BIGs include $(HoTbBi)_3Fe_5O_{12}$ and $(TbLuBi)_3$ $(FeAlGa)_5O_{12}$ etc.

Intensive research have been carried out on rare earth iron garnets as a recording film for a magneto-optic disk and a variety of papers have been reported (Applied Physics. 2., 1973, pp. 219–228; IEEE TRANSACTIONS ON MAGNETICS, VOL. MAG-10, 1974, pp. 480–482; IEEE TRANSACTIONS ON MAGNETICS, VOL. MAG-7, 1971, pp. 397–401; and J. Applied. Physics. 53(3), March 1982, pp. 2754–2758, etc.).

These references disclose methods, principles, and theories of recording, storing, and rewriting data, the methods using the temperature dependence of magnetic properties including the square-shaped hysteresis of rare earth iron garnets.

These references describe a nucleation magnetic field (Hn), which is a measure of stability of the square hysteresis loop of magnetization. Nucleation magnetic field (Hn) is a strength of an external magnetic field applied to a garnet at which the direction of magnetization of the garnet is reversed. When a garnet is place in an external magnetic field in an opposite direction to the direction of magnetization of the garnet and the external magnetic field is increased, a tiny area having a magnetization direction opposite to the direction of the external magnetic field. Then, inversion of magnetization direction is triggered from the tiny area and spreads over the entire garnet body in an avalanche fashion. This tiny area is referred to as nucleation and the field strength of the external magnetic field that gives rise to a nucleation is thus referred to as nucleation magnetic field Hn. One of the above references reports that a garnet chip formed to a size of 1 mm square by etching shows a nucleation field, for example, Hn=1200 Oe, and a garnet having formed to a size of 1 mm square by mechanical scribing shows a nucleation field of 26 Oe, for example. The difference in nucleation field implies that a garnet should be free from defects in shape in order to be magnetically stable.

According to the above references, nucleation field Hn is given by the following equation.

$Hn = a \cdot Hs + b/Hs$ (a and b are proportional constants) The nucleation field Hn diverges as the temperature becomes closer to the magnetic compensation temperature of a garnet material at which the saturation magnetization field Hs of the garnet becomes zero. In other words, closer to a compensation point the temperature is, the larger the nucleation field Hn is. A nucleation field Hn of about several thousand can be observed if a garnet material is nearly ideal. Thus, it appears to be preferable to use a BIG having a compensation temperature near room temperature, as a Faraday rotator that does not use a magnet.

It is not until 20 years after the above references that BIGs having a square hysteresis loop were proposed and put into practical use as a magnet-free Faraday rotator. Japanese Patent Laid-open (KOKAI) No. 06-222311 (Laid open on Aug. 12, 1994) discloses that a BIG having a composition of $(GdRBi)_3(FeGaAl)_5O_{12}$ can be used to manufacture, for example, a magnet-free isolator. EP-0 647 869A1 (Published on Apr. 12, 1995) discloses an isolator having a composition of $(GdBi)_3(FeGaAL)_5O_{12}$. The isolator incorporates a Faraday rotator sandwiched between glass polarizers, and shows an insertion loss of 0.4 dB and an extinction ratio of 38.8 dB at a wavelength of 1.31 μm. The isolator does not require an external magnetic field.

Japanese Patent Laid-open (KOKAI) No. 09-185027 (laid open on Jul. 15, 1997) discloses an embodiment in which a 100 μm-thick BIG having a composition of $Bi_1Eu_1Ho_1Fe_4Ga_1O_{12}$ is cut into a slab of 11.5 mm square and a chip of 2 mm square and the slab and chip have a saturation magnetization 4 πMs<100 G and shows a square hysteresis loop in the temperature range of −40 to +80° C. Although this reference discloses only magnetic properties of the material, the reference describes that the material can also be applied to optical isolators. Patent Preliminary Publication (KOKAI) No. 09-328398 discloses an embodiment in which a garnet has a composition of $(TbBi)_3$ $(FeAlGa)_5O_{12}$, a compensation temperature of zero degrees, a square hysteresis loop, a minimum extinction ratio of 38.8 dB, and a minimum external magnetic field of 164 Oe that can reverse the direction of magnetization of the garnet, and therefore the material can be used as an optical isolator.

Magnet-free optical isolators formed of a BIG can be compact and inexpensive because they do not use a permanent magnet. Optical isolators are subjected to an environmental temperatures higher than 100° C. during manufacture but the garnets are commonly used at room temperature. Thus, it is desirable that the material is stable in a temperature range centered about room temperature. A geometrical defect of a garnet material is a critical factor that affects the stability of the garnet material. A garnet material free from geometrical defects exhibits a strong resistance to an external magnetic field that is applied to the garnet material in such a direction as to destroy the square hysteresis loop of the garnet material.

The inventors manufactured a wafer-shaped BIG having a magnetic compensation temperature near room temperature in the shape of a wafer. Then, the Faraday rotators were manufactured in the following usual manner. The wafer was cut into chips of a size of about 10 mm square. The chips were lapped to such a thickness that the chip has a Faraday rotation angle of about 45 degrees. Then, anti-reflection coating (AR coating) was applied to both surfaces of the chip. Then, the chips were further cut into desired smaller sizes. The Faraday rotators were magnetized at room temperature (24° C.) so that the Faraday rotator acquires a square hysteresis loop. However, most of the magnetized Faraday rotators showed Faraday rotations smaller than they were expected.

This phenomenon is very new and cannot be expected in the usual manner, for example, disclosed in Japanese Patent Preliminary Publication (KOKAI) No. 09-185027, which describes only magnetic properties but suggests applications to isolators. This publication further describes in claim 14 that a BIG preferably has a compensation temperature near room temperature. However, the publication discloses only requirements for optical isolators and makes no mention of a magnetic compensation temperature and specific data of an optical isolator described in the specification. Then, the specification describes on page 6, paragraph 0034, "to assure magnetic saturation and reproducibility, a magnetic field of 2.5 kOe was used for magnetically saturating all samples of Table 1 except for sample 1, for which 12 kOe was used to insure magnetic saturation." In other words, Japanese Patent Preliminary Publication (KOKAI) No. 09-185027 suggests that the use of a sufficiently strong magnetic field ensures magnetic saturation of a material with reliable repeatability.

Thus, the inventors of the present invention assumed that Faraday rotations smaller than they were expected were due to an insufficient magnetic field strength, and therefore the inventors used a magnetic field of about 10,000 Oe to magnetically saturate the garnet material. However, the results remained unchanged. The inventors then demagnetized the chips. Then, the chips were magnetically saturated at 24° C. by using a permanent magnet and then the Faraday rotation angles of the chips were measured. Smaller Faraday rotations were observed in more chips when the chips were saturated by using the permanent magnet than when they were magnetized at 24° C. to add a square hysteresis loop. Thus, there is a need for a method of manufacturing a Faraday rotator having a desired Faraday rotation angle by using a BIG that has a magnetic compensation temperature near room temperature.

SUMMARY OF THE INVENTION

An object of the present invention is to provide a method of manufacturing a magnet-free Faraday rotator by using a BIG that is grown on a non-magnetic garnet substrate by liquid phase epitaxy and has a magnetic compensation temperature in the range of 10 to 40° C. A film of BIG is exposed to an external magnetic field higher than 1000 Oe in a direction normal to the major surface of the film at either a temperature at least 20° C. higher than the magnetic compensation temperature or a temperature at least 20° C. lower than the magnetic compensation temperature, thereby acquiring a square hysteresis loop.

The method is carried out to add a square hysteresis loop to the garnet material after the garnet material has been cut into product sizes.

The square hysteresis loop is preferably added to the garnet material at a temperature that exceeds the compensation temperature by at least 20° C.

The square hysteresis loop is preferably added to the garnet material after the garnet material has been assembled into a non-reciprocal device such as an optical isolator and a circulator.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

Embodiment

A BIG of the invention, which is magnetized to have a square hysteresis loop, has a magnetic compensation temperature in the range of 10 to 40° C. Such a BIG is usually selected from bismuth-substituted rare earth iron garnet single crystals having a composition of $R_{3-x}Bi_xFe_{5-y}A_yO_{12}$, where R is at least one selected from a group consisting of Y, La, Ce, Pr, Nd, Sm, Eu, Gd, Tb, Dy, Ho, Er, Tm, Yb, and Lu, A is at least one selected from a group of Ga, Sc, Al, and In, and x has the range of $0.7 \leq x \leq 0.5$ and y has the range of $0.5 \leq y \leq 1.5$.

As is well known in the art, the net magnetization of iron (Fe) sites in the crystal of a BIG is opposite in orientation to that of rare earth elements. The magnetization of both iron and rare earth elements increases with decreasing temperature and the temperature dependence of the magnetization of rare earth elements is larger than that of iron at low temperatures. Thus, the net magnetization due to iron site is equal to that of rare earth elements but opposite in orientation at a certain temperature, and therefore the resulting magnetization of the garnet material is zero at that temperature. This temperature is referred to as compensation temperature. Bismuth (Bi) replaces a portion of rare earth elements and increases the Faraday rotation angle of the garnet greatly and therefore is an essential element. The garnet includes bismuth (Bi) as an impurity. The iron site has a magnetization consisting of a group of two iron atoms and a group of three iron atoms, the two groups being opposite in magnetic orientation. Thus, bismuth is an element that substitutes one resultant iron atom to decrease the magnetization resulting from one iron atom. As is clear from the above description, rare earth elements having less temperature dependence can be employed in order to decrease the temperature dependence of magnetization.

For practicing the present invention, a substrate used in liquid phase epitaxy can be of any one of known substrates. Usually, a substrate can be selected from among non-magnetic garnets $[(GdCa)_3(GaMgZr)_5O_{12}]$ so called SGGG substrate, on the market. The SGGG substrates have lattice constants in the range 1.2490 nm to 1.2515 nm.

In the present invention, a square hysteresis loop is added to a BIG by applying an external magnetic field of higher than 1000 Oe in a direction normal to the major surface of the crystal at a temperature at least 20° C. higher than the compensation temperature or at a temperature at least 20° C. lower than the compensation temperature. When a square hysteresis loop is added to a garnet material at a temperature at least 20° C. lower than the magnetic compensation temperature, the apparatus required will be expensive and large in size. Thus, it is simple and convenient to add a square hysteresis loop at a temperature at least 20° C. higher than the compensation temperature. The upper limit of the temperature may be at least 10° C. lower than a Curie point of the BIG and a time of about several seconds or longer is enough for sufficiently magnetizing the garnet to add a square hysteresis loop.

A square hysteresis loop is added to the garnet after the material has been cut into desired product sizes. In other words, the garnet material is cut into product sizes and then a square hysteresis is added under a predetermined condition. Then, the physical quantities of the garnet are measured at room temperature. Only those passed examinations are shipped. From a point of view of reliability, magnetization to add a square hysteresis loop to a garnet material should be carried out after the garnet material has been assembled into a non-reciprocal device such as an optical isolator or an optical circulator. The magnetization may be performed before the garnet is assembled into a non-reciprocal device, provided that the square hysteresis loop is not lost due to conditions such as temperature and mechanical stress encountered during the assembly. When the garnet of the invention is applied to, for example, an isolator, polarizing film that serves as a polarizer and an analyzer is bonded to the BIG film and then the entire assembly is subjected to magnetization to add a square hysteresis loop.

EXAMPLES

The present invention will be described in detail by way of specific examples. The examples are only exemplary and the present invention is not limited to these examples.

Example 1

The following materials were put in a platinum crucible of 3000 ml capacity: 3,500 gm lead oxide (PbO, 4N), 3,700 gm bismuth oxide ($Bi_2O_3$, 4N), 450 gm ferric oxide ($Fe_2O_3$, 4N), 170 gm boron oxide ($B_2O_3$, 5N), 46.0 gm terbium oxide ($Tb_2O_3$), 65.0 gm gallium oxide ($Ga_2O_3$, 3N), and 5.7 gm aluminum oxide ($Al_2O_3$, 3N). The crucible was placed in a vertical electric furnace and heated to 1,000° C. to melt for 24 hours. Then, the melt was agitated for one hour and then left for 24 hours, thereby preparing a melt for growing a BIG.

The melt was cooled to a temperature below saturation temperature, and then a 3-in. (111) substrate of a garnet single crystal [GdCa]3(GaMgZr)5O12] having a thickness of 800 μm and a lattice constant of 1.2497 nm±0.0002 nm was held such that the one side of the substrate is in contact with the melt. Then, the substrate is rotated to expitaxially grow on the substrate a BIG film $(TbBi)_3(FeGaAl)_5O_{12}$ (referred to as TbBiG-1 hereinafter) having a thickness of 537 μm. The melt adhering to the TbBiG-1 was dissolved in an aqueous solution of hydrochloric acid and then cut into a size of 10 mm×10 mm. Then, the 10 mm×10 mm TbBiG-1 was lapped such that the Faraday rotator of TbBiG-1 is 45 degrees and subsequently anti-reflection coating having a center wavelength of 1.550 nm was applied to both major surfaces of the film. The resulting TbBi-1 had a compensation temperature of 8±3° C.

Five 10 mm×10 mm TbBiG-1 were randomly selected and cut into chips having a size of 1.6 mm×1.6 mm. A total of 180 chips were evaluated by the following Tests (1) to (3).

(1) Measure the Faraday rotation angle of each chip at room temperature (24° C.) by applying to the chip an external magnetic field of 2000 Oe which is enough to magnetically saturate the chip.

(2) Magnetize each chip at room temperature (24° C.) by applying an external magnetic field of 2000 Oe. Then, measure the Faraday rotation angle of each chip without applying an external magnetic field, and measure the nucleation field of the chip.

(3) Magnetize each chip at 60° C. by applying an external magnetic field of 2000 Oe. Then, measure the Faraday rotation angle of each chip at room temperature (24° C.) without applying an external magnetic field, and measure the nucleation field of the chip at room temperature (24° C.).

Results of Test (1)

A total of 11 chips showed Faraday rotation angles of less than 43 degrees, i.e., 6% of the tested chips did not meet the requirement of 45 degrees.

Results of Test (2)

A total of 168 chips met the requirement of Faraday rotation angle of 45.2±0.2 degrees. The nucleation fields of the chips were measured and all of 168 chips showed a square hysteresis loop. The nucleation fields of the chips were in the range of 200 to 1200 Oe and a total of 154 chips showed nucleation fields of higher than 300 Oe. In other words, 154 chips out of the total 180 chips met the requirements of Faraday rotation angle, insertion loss, extinction ratio, and coercive force. Thus, acceptable products represented 86% of the total of 180 chips.

Results of Test (3)

The Faraday rotations of a total of 180 chips were within 45.0±0.2 degrees. All the chips met the requirements of extinction ratio of higher than 40 dB, and insertion loss of less than 0.1 dB. In other words, all the chips provided performance as required of a Faraday rotator. The nucleation fields Hn of the chips were in the range of 200 to 1200 Oe and 174 chips showed nucleation fields higher than 300 Oe. In other words, 174 chips out of 180 chips met the requirements of Faraday rotation angle, insertion loss, extinction ratio, and coercive force. Acceptable products represented 97% of the total of 180 chips.

Example 2

The following materials were put in a platinum crucible of 3000 ml capacity: 3,500 gm lead oxide (PbO, 4N), 3,700 gm bismuth oxide ($Bi_2O_3$, 4N), 450 gm ferric oxide ($Fe_2O_3$, 4N), 170 gm boron oxide ($B_2O_3$, 5N), 46.0 gm terbium oxide ($Tb_2O_3$), 69.0 gm gallium oxide ($Ga_2O_3$, 3N), and 5.9 gm aluminum oxide ($Al_2O_3$, 3N). The crucible was placed in a vertical electric furnace and heated to 1,000° C. to melt for 24 hours. Then, the melt was agitated for one hour and then left for 24 hours, thereby preparing a melt for growing a bismuth substituted rare earth iron garnet single crystal. The melt was cooled to a temperature below the saturation temperature, and then a 3-in. (111) substrate of a garnet single crystal [GdCa]3(GaMgZr)5O12] having a thickness of 800 μm and a lattice constant of 1.2497 nm±0.0002 nm was positioned such that the one side of the substrate is in contact with the melt. Then, the substrate is rotated to expitaxially grow on the substrate a bismuth-substituted rare earth iron garnet single crystal film $(TbBi)_3(FeGaAl)_5O_{12}$ (referred to as TbBiG-2 hereinafter) having a thickness of 525 μm. The melt adhering to the TbBiG-2 was dissolved in an aqueous solution of hydrochloric acid and then cut into a size of 10 mm×10 mm. Then, the 10 mm×10 mm TbBiG-2 was lapped such that the Faraday rotator is 45 degrees and subsequently anti-reflection coating having a center wavelength of 1.550 nm was applied to both major surfaces of the film. The resulting TbBi-2 had a compensation temperature of 8±3° C. Five were randomly selected from a total of twenty eight 10 mm×10 mm TbBiG-2 and cut into chips having a size of 1.6 mm×1.6 mm.

A total of 180 chips were evaluated by conducting Tests (1) to (3) just as in Example 1.

Results of Test (1)

A total 136 chips showed Faraday rotation angles of less than 43 degrees, i.e., 76% of the chips tested did not meet the requirement of 45 degrees.

Results of Test (2)

A total of 135 chips showed Faraday rotation angles less than 43 degrees, i.e., 75% of the chips did not meet the requirement of Faraday rotation angle. The nucleation fields of the chips were measured and all of 135 chips showed a square hysteresis loop. The nucleation field of the chips was in the range of 200 to 1400 Oe and a total of 113 chips showed nucleation fields of higher than 300 Oe. All of 45 chips that met the requirement of Faraday rotation angle showed a square hysteresis loop. The nucleation fields of the 45 chips were in the range of 200 to 1400 Oe, and 43 chips out of the 45 chips showed nucleation field higher than 300 Oe. In other words, 43 chips out of the total 180 chips met the requirements of Faraday rotation angle, insertion loss, extinction ratio, and coercive force. Acceptable products represented 24% of the total of 180 chips.

Results of Test (3)

The total of 180 chips were within 45.2±0.2 degrees. All the chips met the requirements of extinction ratio higher than 40 dB, and insertion loss less than 0.1 dB. In other words, all the chips provide performance as required of a Faraday rotator. The nucleation fields Hn of the chips were in the range of 200 to 1400 Oe and 170 chips showed nucleation fields higher than 300 Oe. In other words, 170 chips out of the 180 chips met the requirements of Faraday rotation angle, insertion loss, extinction ratio, and coercive force. Thus, acceptable products represented 94% of the total of 180 chips.

The chips that were subjected to Test (2) were subjected to an additional test. In other words, an external magnetic field of about 10,000 Oe was applied to the chips at room temperature (24° C.) to add a square hysteresis loop to the chips. The result is that 134 chips showed Faraday rotation angles of less than 43 degrees, i.e., 47% of the chips failed. The nucleation filed of the chips was measured and all of the chips showed a square hysteresis loop. The nucleation field of the chips was in the range of 200 to 1600 Oe and 43 chips showed nucleation fields of higher than 300 Oe. In other words, 43 chips out of 180 chips met the requirements of Faraday rotation angle, insertion loss, extinction ratio, and coercive force. Thus, acceptable products represented 24% of the total of 180 chips.

The aforementioned additional test was conducted for the following reasons. The chips according to Example 1 have a compensation temperature of 18±3 degrees, which is very close to room temperature. Because nucleation field Hn diverges as the temperature approaches the compensation temperature, it is very likely that the chips have a very high nucleation field Hn. Thus, it was assumed that a very large external magnetic field was required for sufficiently magnetizing the chips. However, It is not a high external magnetic field that is essential to properly magnetize chips. For proper magnetization, it is essential to apply an external magnetic field in the range of 1000 to 2000 Oe where a resulting nucleation field Hn is much lower than 1000 Oe.

The following materials were put in a platinum crucible of 3000 ml capacity: 3,500 gm lead oxide (PbO, 4N), 3,700 gm bismuth oxide ($Bi_2O_3$, 4N), 450 gm ferric oxide ($Fe_2O_3$, 4N), 170 gm boron oxide ($B_2O_3$, 5N), 46.0 gm terbium oxide ($Tb_2O_3$), 70.0 gm gallium oxide ($Ga_2O_3$, 3N), and 6.2 gm aluminum oxide ($Al_2O_3$, 3N). The crucible was placed in a vertical electric furnace and heated to 1,000° C. to melt for 24 hours. Then, the melt was agitated for one hour and then left for 24 hours, thereby preparing a melt for growing a bismuth substituted iron garnet single crystal. In the same way as Example 1, the melt was used to grow on the substrate a BIG film $(TbBi)_3(FeGaAl)_5O_{12}$ (referred to as TbBiG-3 hereinafter) having a thickness of 552 μm. The melt adhering to the TbBiG-3 was dissolved in an aqueous solution of hydrochloric acid and then cut into a size of 10.5 mm×10.5 mm. Then, an anti-reflection coating was applied to both major surfaces of the film of 10.5 mm×10.5 mm TbBiG-3. The resulting TbBi-3 had a compensation temperature of 24±3° C. Five chips were randomly selected from a total of twenty eight 10.5 mm×10.5 mm TbBiG-2 and cut into chips having a size of 1.6 mm×1.6 mm.

A total of 180 chips were evaluated by the Tests (1) to (3) just as in Example 1.

Results of Test (1)

A total of 175 chips showed Faraday rotation angles of less than 43 degrees, i.e., 97% of the tested chips did not meet the requirement of 45 degrees.

Results of Test (2)

A total of 170 chips showed Faraday rotation angles less than 43 degrees, i.e., 94% of the chips did not meet the requirement of Faraday rotation angle. The nucleation fields of the chips were measured and all of 180 chips showed a square hysteresis loop. The nucleation field of the chips was in the range of 200 to 1900 Oe and a total of 159 chips showed nucleation fields of higher than 300 Oe. All of 10 chips that met the requirement of Faraday rotation angle showed a square hysteresis loop. The nucleation fields of the 10 chips were in the range of 200 to 1600 Oe, and 9 chips out of the 180 chips showed nucleation fields higher than 300 Oe. In other words, 9 chips out of 180 chips met the requirements of Faraday rotation angle, insertion loss, extinction ratio, and coercive force. Thus, acceptable products represented 5% of the total of 180 chips.

Results of Test (3)

A total of 168 chips were within 44.6±0.2 degrees. Thus, acceptable products represented 93% of the total 180 chips. All of 168 chips that met the requirement of Faraday rotation angle met the requirements of extinction ratio of higher than 40 dB and insertion loss of less than 0.1 dB. In other words, all the chips provide performance as required of a Faraday rotator. The nucleation fields Hn of the chips were in the range of 400 to 2000 Oe, i.e., all the chips showed nucleation fields higher than 300 Oe. In other words, 168 chips out of 180 chips met the requirements of Faraday rotation angle, insertion loss, extinction ratio, and coercive force. Acceptable products represented 93% of the total of 180 chips.

According to the present invention, a magnet-free Faraday rotator can be manufactured by using a bismuth-substituted rare earth iron garnet single crystal that has a magnetic compensation temperature at room temperature or near room temperature.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A method of manufacturing a magnet-free Faraday rotator having a square hysteresis loop, the Faraday rotator being formed of a bismuth-substituted rare earth iron garnet single crystal that has a compensation temperature in the range of 10 to 40° C. and is grown on a non-magnetic garnet substrate by a liquid phase epitaxy, the method comprising the steps of:

placing the bismuth-substituted rare earth iron garnet single crystal film in an environment of a temperature at least 20° C. away from the compensation temperature; and applying an external magnetic field higher than 1000 Oe to the bismuth-substituted rare earth iron garnet single crystal film so that the bismuth-substituted rare earth iron garnet single crystal film is magnetized to have a square hysteresis loop.

2. The method according to claim 1, wherein said placing the bismuth-substituted rare earth iron garnet single crystal film in the environment and said applying an external magnetic field are performed after the bismuth-substituted rare earth iron garnet single crystal film has been cut into a product size.

3. The method according to claim 1, wherein said placing the bismuth-substituted rare earth iron garnet single crystal film in the environment and said applying an external magnetic field are performed at a temperature at least 20° C. higher than the compensation temperature.

4. The method according to claim 1, wherein said placing the bismuth-substituted rare earth iron garnet single crystal film in the environment and said applying an external magnetic field are performed after the bismuth-substituted rare earth iron garnet single crystal film has been assembled into a non-reciprocal optical device.

5. The method according to claim 1, wherein the non-reciprocal device includes an optical isolator and an optical circulator.

* * * * *